United States Patent [19]

Priewasser et al.

[11] Patent Number: 5,254,300
[45] Date of Patent: Oct. 19, 1993

[54] PROCESS FOR CASTING SILICON BLOCKS OF COLUMNAR STRUCTURE

[75] Inventors: Georg Priewasser, Ach, Austria; Lothar Huber, Burghausen, Fed. Rep. of Germany; Gerhard Spatzier, Egglsberg, Austria

[73] Assignee: Wacker-Chemitronic Gesellschaft fur Elektronik-Grundstoffe mbH, Burghausen, Fed. Rep. of Germany

[21] Appl. No.: 712,340

[22] Filed: Jun. 7, 1991

[30] Foreign Application Priority Data

Jun. 13, 1990 [DE] Fed. Rep. of Germany ....... 4018967

[51] Int. Cl.$^5$ .............................................. C04B 35/60
[52] U.S. Cl. ................................ 264/40.4; 264/327; 264/332
[58] Field of Search .................. 264/40.4, 327, 332

[56] References Cited

U.S. PATENT DOCUMENTS

| | | | |
|---|---|---|---|
| 4,256,681 | 3/1981 | Lindmayer | 264/332 |
| 4,382,838 | 5/1983 | Authier | 156/616 R |
| 4,690,797 | 9/1987 | Eyer et al. | 264/332 |
| 4,769,107 | 9/1988 | Helmreich et al. | 156/616.2 |
| 4,834,382 | 5/1989 | Spector | 273/65 EG |

OTHER PUBLICATIONS

J. M. Borrego et al., "Non-Destructive Lifetime Measurement in Silicon Wafers by Microwave Reflection," *Solid State Electronics*, vol. 30, No. 2, pp. 195–201, 1987.

Primary Examiner—Jan H. Silbaugh
Assistant Examiner—Christopher A. Fiorilla
Attorney, Agent, or Firm—Collard & Roe

[57] ABSTRACT

By means of the process and by means of the apparatus, fused silicon is produced continuously, or in phases, and zonally cast into a mold in which it is caused to solidify zonally. The temperature conditions in the solidification zone are controlled with the aid of a movable heating zone, by means of which the crystallization front is adjusted to the rising level that fills up the mold, this level being in turn controlled by the fusion rate of the silicon. Polycrystalline silicon blocks can be obtained in which, because of the flat shape of the crystallization front, the columnar single-crystal domains within the blocks extend almost vertically and which represent an excellent solar cell base material having high diffusion lengths and lifetimes of the minority charge carriers, from which solar cells of correspondingly high efficiencies can be produced.

6 Claims, 1 Drawing Sheet

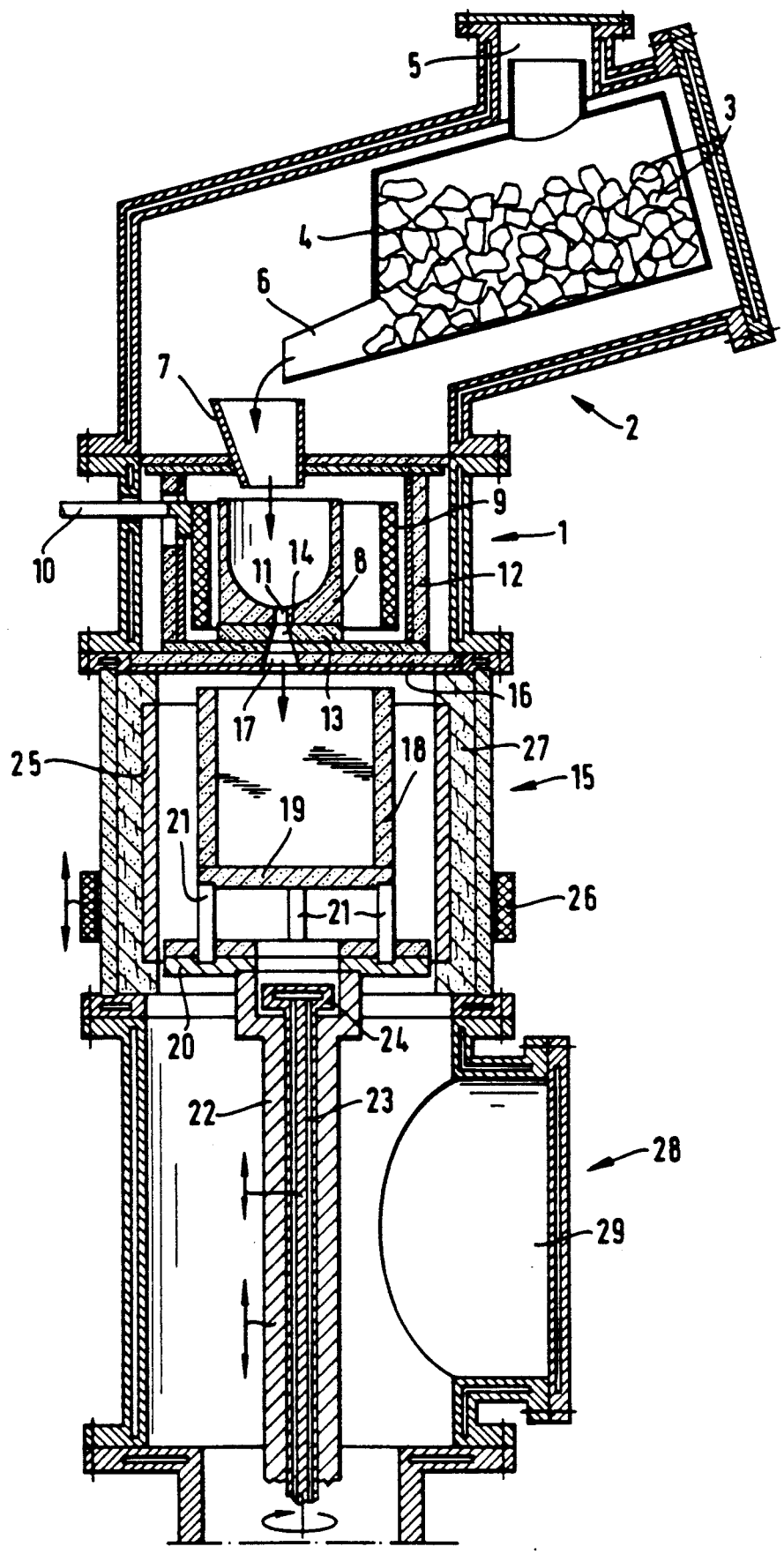

PROCESS FOR CASTING SILICON BLOCKS OF COLUMNAR STRUCTURE

BACKGROUND OF THE INVENTION

1. Field of the Invention

The present invention relates to a process for casting polycrystalline silicon blocks as a base material for solar cells, in which introduced solid silicon is gradually fused by supplying heat in a melting station, released from there continuously or in phases, fed to a mold and caused to solidify therein, and to equipment for carrying out the process.

2. The Prior Art

Such a process is known from European Patent No. 55,310. In this process, as also in other hitherto known processes, molten silicon is cast to give polycrystalline blocks (see, U.S. Pat. No. 4,382,838) which are eventually sawn into disks, and if appropriate, separating off unsuitable edge regions and severing into smaller blocks. They are subsequently further processed to yield solar cells. The mold is always completely filled with the silicon melt and the actual solidification step is only then initiated, if appropriate, after transfer to a separate crystallization station. It is typical of the blocks obtained that, in most cases, an approximately vertical alignment of the monocrystalline regions can be observed only in the center, whereas the orientation in the direction of the edge regions parabolically approaches the horizontal. The consequences of this crystallization characteristic are, on the one hand, a greater number of crystal defects in the crystallites and, on the other hand, unfavorable segregation effects which lead to an enrichment of residual impurities in the interior of the blocks. Both these effects, however, shorten the diffusion lengths of the minority carriers and, thus, reduce in the end the efficiency of the solar cells obtained.

Ever since the technology of casting silicon blocks as a base material for solar cells began (see, for example, German Patent No. 2,508,803, and the corresponding U.S. Pat. No. 4,382,838), the object was, therefore, to arrange the crystallization of the molten silicon in the mold in such a way that, as much as possible, vertical crystalline growth starting from the mold bottom occurs, and the so-called "edge growth" starting from the mold walls is suppressed as much as possible. Such a process method, which greatly reduces the heat flux via the side walls of the mold, results, however, in long contact times between the mold wall and the melt, which leads to an enrichment of impurities in the block material.

Another attempted solution practiced in a number of the known casting processes, therefore, aims for rapid solidification of the melt in the entire edge region, i.e., especially from the side walls of the mold (see, for example, German Offenlegungschrift No. 3,427,465 and the corresponding U.S. Pat. No. 4,769,107). In this case, however, increased edge growth must be accepted in any case, even if attempts are made by additional heating measures to slow down this growth significantly in the interior of the blocks.

SUMMARY OF THE INVENTION

It is, therefore, an object of the present invention to provide a casting process according to which silicon blocks can be obtained which are distinguished by an approximately vertical orientation of the crystallites and, at the same time, show only slight edge growth.

This object is achieved by a process which comprises, in the initial phase of the casting step, generating a crystallization front which extends over the mold cross-section in the bottom region between solidified and molten silicon and which is stabilized by means of a heating zone surrounding the bottom region of the mold and, in the further course of the casting step with the supply of molten silicon from the melting station, adjusting the crystallization front to the rising filling level, the front being held within the heating zone by a relative movement between the mold and the heating zone, and controlling the melt level of the molten silicon superimposed upon the crystallization front by matching the quantity of melt fed, controlled by the heat supply to the melting station, to the energy supplied to the heating zone.

In particular, the present invention is directed to a process for casting polycrystalline silicon blocks as a base material for solar cells, comprising: gradually fusing solid silicon in a melting station by supplying a heat supply to the melting station; releasing the fused silicon therefrom continuously, or in phases, as molten silicon; casting the fused silicon into a mold and causing the silicon to solidify therein, said mold having a cross-section and a bottom region, said casting having an initial phase and a further phase; in said initial phase of the casting, generating a crystallization front which extends over the mold cross-section in the bottom region between solidified silicon and fused molten silicon; stabilizing the crystallization front with an energy supply to a heating zone surrounding the bottom region of the mold; in the further phase of the casting with the supply of fused molten silicon from the melting station, adjusting the crystallization front to a rising filling level of the mold, the crystallization front being held within the heating zone by a relative movement between the mold and the heating zone; and controlling a melt level of the molten silicon superposed upon the crystallization front by matching the quantity of melt fed, controlled by the heat supply to the melting station, to the energy supply to the heating zone.

Equipment suitable for carrying out this process contains a heatable melting station, which allows a continuous or cyclic feed of silicon to be fused and a continuous release of molten silicon and, connected thereto, at least one crystallizing station which can be charged with a mold suitable for receiving the molten silicon and contains means for heating the mold, and comprises a heating zone, which surrounds the mold and whose height corresponds to 0.1 to 0.5 times the external diameter of the mold, and means which allow a vertical relative movement between the heating zone and the mold.

More particularly, the present invention is directed to an apparatus for casting polycrystalline silicon blocks as a base material for solar cells comprising: a heatable melting station; means for providing a continuous or cyclic feed of silicon to be fused in said melting station into molten silicon; means for the continuous release of molten silicon from said melting station; at least one crystallizing station connected to said melting station; a mold in said crystallizing station suitable for receiving the molten silicon, said mold having an external diameter; means for heating the mold and said heating means surrounding the mold and having a height, and said height corresponds to 0.1 to 0.5 times the external diameter of the mold; and means for allowing a vertical relative movement between the heating means and the mold.

BRIEF DESCRIPTION OF THE DRAWINGS

Other objects and features of the present invention will become apparent from the following detailed description considered in connection with the accompanying drawing which discloses one embodiment of the present invention. It should be understood, however, that this drawing is designed for the purpose of illustration only and not as a definition of the limits of the invention.

The FIGURE shows a preferred embodiment of equipment suitable for carrying out the process. By reference to this FIGURE, the process according to the invention is, at the same time, also explained in greater detail below.

DETAILED DESCRIPTION OF PREFERRED EMBODIMENT

Melting crucibles in which introduced solid silicon is gradually fused by supplying heat and released continuously in the molten form are known to those skilled in the art and are described, for example, in the above-mentioned European Patent No. 55,310 or in German Patent No. 3,531,610, or in the corresponding U.S. Pat. No. 4,834,382. Analogously designed melting crucibles can also be used for the melting station in the present invention. A preferred embodiment is shown in the drawing FIGURE.

Referring now in detail to the drawing, the actual melting station 1 is preceded here by a charging station 2, in which the silicon 3 to be fused has been introduced into a silicon reservoir 4, for example, in a lumpy, gritty or granular form. Further material can be fed, for example, via the charging lock 5. In accordance with the quantity of material required in the melting station, the silicon can then be transported by suitable transfer devices 6, for example, a shaking channel or a conveyor belt, to the outlet orifice, for example, the charging hopper 7, through which it finally leaves the charging station and passes into the actual melting station 1.

In the latter, the silicon charged in is received in the melting crucible 8 and caused to fuse gradually. The requisite heating energy is supplied via the melting crucible heater 9, where the energy supply can be effected, for example, via the lead 10 if, for example, resistance heating is provided, by means of which temperature profiles can be adjusted with particular accuracy. In principle, however, heating of the melting crucible can also be effected by means of inductive or radiant heating. In accordance with the heating power supplied, the silicon pieces in the melting crucible start to fuse gradually, as a result of which the molten silicon flows to the bottom of the crucible and can flow out continuously or periodically through the outlet orifice 11, which is a bore of about 0.5 to 15 mm and preferably 1 to 10 mm in diameter. By increasing or reducing the heating power, it is then possible to control the fusion rate of the silicon and, hence, the quantity of the melt flowing out or the periodic onset and decay of the melting step.

Advantageously, the melting crucible is located in the interior of an additional insulation chamber 12 made of a thermally insulating material such as, e.g., graphite, graphite felt or silicon nitride, which chamber is in turn surrounded by the actual outer walls of the melting station. In this way, energy losses through the outer walls which are, as a rule, cooled, can be minimized, and fluctuations in the heating power supplied can also be compensated.

In the process, melting crucibles made of quartz have proven suitable, since these, after a starting phase, can be operated in a temperature range in which quartz is already plastic, so that there is then only a slight risk of breakage. In principle, however, other materials which are substantially inert towards molten silicon, to a corresponding or greater extent, can also be used, such as, for example, silicon carbide or silicon nitride.

Especially if quartz crucibles are used, it has been found to be advantageous for stabilizing the bottom of the crucible against deformation to provide an additional base 13, for example, made of graphite materials or silicon nitride. The passage orifice 14 for the silicon flowing out is then advantageously designed to widen conically, in order to avoid wall contact of the melt jet which, as a rule, does not flow out in an ideally vertical direction.

Even though it is possible, in principle, to allow a direct transition of the melting station 1 and the adjoining crystallization station 15 from one into the other and without separating devices which effect a partial or complete separation, a preferred embodiment provides an interposed plate 16, by means of which, in particular, the gas exchange between the melting station and crystallization station is restricted or, at the limit, suppressed. In this way, an entrainment of impurities such as, for example, silicon monoxide or silicon carbide particles between the two stations via the gas phase can be prevented in a simple manner, and the purity of the product can, thus, be improved.

Underneath the outlet orifice 11 of the melting crucible and, if appropriate, the passage orifice 14 of the base, an advantageously conically widening passage orifice 17, whose internal width is preferably greater than the spread of the melt jet flowing through, in order to avoid contact thereof with the wall and hence to reduce the risk of contamination is provided in the interposed plate.

If an interposed plate which consists of a material inert under the process conditions and having a high thermal insulation capacity is provided, such as, for example, silicon nitride, the influence of the melting crucible heating on the temperature conditions in the crystallization station can be kept small. If, however, interposed plates consisting of a material having a higher thermal conductivity and showing an inert behavior under the process conditions, such as the graphite materials or graphite fiber materials preferably used, or high temperature-resistant metals such as, for example, molybdenum or tantalum, are used, more heat radiation from the top of the crystallization station can be obtained. This assists in the prevention of the freezing, which is undesirable because of the volume expansion during solidification of the free surface of the silicon passing into the crystallization station. Thus, the selection of the plate material can contribute to an optimization of the thermal conditions in the crystallization station. If desired, even an additional heating facility for the interposed plate can be provided.

In the crystallization station 15, the silicon flowing in as a continuous or phased jet is received in the mold 18, whose interior approximately corresponds to the dimensions of the block to be produced. It is convenient additionally to provide an edge zone of advantageously about 0.5 to 10 mm thickness, in which any impurities can also concentrate and which can be separated from the complete block after it has been taken out, for example, in order to adapt the dimensions of the block to a predetermined nominal size. In the case of a standard size of the square solar cells of 100×100 mm², mold cross-sections from 210×210 to 430×430 mm² have proven suitable. Since the process according to the invention makes it possible because of the favorable crystallization behavior to produce blocks which are higher than those of the known processes, molds of heights from 20 to 50 cm can be used. In principle, however, the upper limits are essentially given by machine engineering, so that even greater mold heights are not excluded.

Advantageously, the mold wall consists of a high temperature-resistant material such as, for example, graphite, which is expediently provided, at least on the surfaces coming into contact with molten silicon, with coverings or coatings of a silicon-resistant ceramic material such as, for example, a material based on quartz, silicon nitride or zirconium oxide. Substances of his type are, in principle, also suitable as materials for the mold walls in the same way as, for example, also coated alumina. Moreover, slag systems can also be used for the covering or coating.

Advantageously, the interior of the mold has a cubic to cuboid shape, whereas the outer wall is preferably cylindrical, but here again, a cubic to cuboid or even polyhedral shape such as, for example, a hexagonally or octagonally prismatic shape, is not excluded, in principle.

Advantageously, the mold bottom 19 does not rest directly on the carrier plate 20 which can be rotated and cooled and which can be made, for example, of high temperature-resistant inert materials such as graphite, silicon carbide or silicon nitride, but is separated from this plate by spacers, for example, spacer rods 21, made, for example, of graphite, graphite composites, silicon nitride or alumina, so that an interspace accessible to the action of heating power is formed underneath the mold. The carrier plate 20 is connected to a rotatable shaft 22 which can be raised and lowered and which advantageously has a cooling head 24 which is supplied via the cooling channel 23 with a coolant, as a rule, water or steam, and which advantageously is height-adjustable and can be brought into contact with, or separated from the carrier plate or advantageously, by means of an appropriate opening in the latter, directly with the mold bottom. A double effect can be achieved in this way, namely by, on the one hand, intensifying the cooling of the mold bottom while, on the other hand, the mold can be moved into the casting position in the crystallization station, rotated during the casting step, if necessary, and finally moved back into a transport position outside the crystallization station. Other methods are also possible for cooling the mold bottom, such as, for example, blowing with inert cooling gases or cooling gas mixtures, for example, argon or helium.

The heating zone which is required for carrying out the process according to the invention can be provided, according to a preferred embodiment, by installing a heating wall 25 on the inner wall side of the crystallization station, facing the lateral outer wall of the mold, the height of the heating wall essentially corresponding to the length, along which the heating zone is moved relative to the mold during the casting step. The heating wall consists of an inductively heatable material such as, for example, metals such as molybdenum or tantalum, or preferably of graphite. The energy required for producing the heating zone is fed in via an inductive heating coil 26 which surrounds the outside of the crystallization station and can be moved vertically. A height of the inductive heating coil and, hence, ultimately also of the heating zone, corresponding to 0.1 to 0.5 times, especially 0.2 to 0.4 times, the external diameter of the mold has proved here to be particularly advantageous.

In order to minimize the heat losses to the outside, the outer wall of the crystallization station is advantageously faced with an insulating layer 27, for example, made of a knitted temperature-resistant material such as, for example, graphite felt.

Another possibility of producing the heating zone is, for example, to provide a vertically movable resistance-heated heating ring or heating strip surrounding the mold. Moreover, the use of radiant heaters is not excluded in principle. In this case, the actual receiver wall in the region of the crystallization station can be made of an appropriately temperature-resistant metal such as, for example, stainless steel. If the heating zone is produced by means of inductive methods, however, non-coupling material is suitable above all, ceramic material such as quartz, quartz glass or glass ceramics having particularly proved themselves.

The relative movement between the mold and heating zone can, as in the present embodiment, be effected by moving the heating zone vertically upwards. However, a downward movement of the mold with a fixed heating zone, or even a combined movement of mold and heating zone, are also not excluded. Preferably, however, the movement is effected by a translation of the heating zone, in order to minimize the free length of the melt jet between the melting crucible and the mold.

Ultimately, the heating zone corresponds to a temperature field, within which the mold contents pass through the melting temperature or solidification temperature of the silicon and which can be vertically moved with infinite adjustment through the interior of the mold provided for filling with silicon. As a first approximation, the effective height of the heating zone and, hence, of the temperature field, can be estimated from the height of the generating heater device, that is to say, for example, of the inductive heating coil, the heating ring or heating strip.

Advantageously, a distributing station 28 is arranged underneath the crystallization station and connected thereto, for example, via a flange system. In such a vertically constructed arrangement, the relative movement between the heating zone and mold can be accomplished in a particularly simple manner. In principle, however, horizontally constructed arrangements are also possible, in which the distributor station is located next to the crystallization station. Variants are also possible in which one station for introducing and one station for removing the empty and filled molds, respectively, are provided in place of a distributor station.

The entire arrangement is surrounded by a gas-tight receptacle which allows a working atmosphere of controlled composition to be established, and the individual stations can advantageously be separated from one another by suitable barrier elements such as locks or slides. As a rule, the receptacle is made of stainless steel and designed with double walls or provided with cooling channels, so that it can be cooled by means of a coolant flowing through. As already stated, however, non-coupling materials such as, for example, quartz, quartz glass or the like, are advisable as the material for the receptacle wall in regions in which heating is effected inductively by means of energy sources, for example, inductive heating coils, located outside the receptacle.

The preferred embodiment illustrated in the FIGURE can be charged, for example, via an inlet and outlet lock opening 29, with an empty prepared mold which can be placed, if appropriate, together with the carrier plate, onto the shaft lowered into the loading and unloading station, for example, by means of a transport fork. After a suitable working atmosphere such as, for example, an argon or helium/nitrogen atmosphere has been established and, if necessary, the mold has been baked, the barrier element generally provided, for example, a vacuum slide, between the distributor station and crystallization station can be opened. The mold can then be moved upwards into the crystallization station by means of the shaft, until it has reached the casting position, in which the mold opening is moved as closely as possible to the passage orifice in the interposed plate, out of which the molten silicon flows during the casting process.

Advantageously, the melting crucible is also preheated to a temperature of about 1150° C. to 1400° C., preferably 1250° C. to 1350° C., in this phase of the process, in order to reach the plastic region of the quartz, so that, if required, the charging of solid, advantageously lumpy silicon can be started immediately.

When the mold has reached the casting position, or while it is being moved into this position, the establishment of the heating zone can also be started. The inductive heating coil is then advantageously in the position in which the heating power generated essentially flows into the interspace between the mold and the carrier plate, in the end position of the mold, so that above all, the mold bottom is heated. The temperature can be monitored, for example, by means of thermocouples or pyrometers; advantageously, the mold bottom is heated to a temperature just above the melting point of silicon.

Expediently, the melting crucible can already be charged with silicon when the mold bottom has reached a temperature of about 1200° C. to 1300° C., the heating power acting on the crucible being increased simultaneously and its temperature being raised to a value above the melting point of silicon (about 1420° C.), advantageously to about 1450° C. to 1600° C. The silicon being charged thus starts to melt incipiently on the surface; the molten material drips downwards, collects on the bottom of the melting crucible and flows through the outlet orifice as a jet which gradually grows in size with increased melting throughput and finally stabilizes at an essentially constant outflow rate.

The silicon which has flowed out is collected in the mold and gradually covers the mold bottom completely as a molten pool. In accordance with the rising filling level in the mold, the heating coil is then gradually moved upwards, so that ultimately the zone of highest temperature in the heating zone produced is approximately at the same height as the surface of the melt. Since, at this stage, the mold bottom is fed with a reduced heating power as compared to the start of the process, it begins to cool slightly, and the crystallization of the silicon can start from the bottom. Since a substantial part of the heating power passes into the mold interior through the side walls of the mold, an approximately horizontal, and sometimes even convex, crystallization front between the molten silicon and the solidified silicon can be built up and stabilized by increasing or reducing the coil power. An essentially flat shape of the crystallization front has here proved to be advantageous, but minor deviations in the direction of a slightly concave or convex shape, as a rule, do not lead to any deterioration in the block quality.

This initial phase of generating and stabilizing the crystallization front is followed by the growth phase in which, on the one hand, further molten silicon flows into the mold continuously or in phases and, on the other hand, the crystallization front moves away from the bottom region with increasing filling level and, with ideal process control, migrates upwards in the mold, essentially synchronously with the surface of the melt. Ultimately, this means continuous zonal growth of the block until the intended filling level in the mold has been reached, so that the further feeding of molten silicon can be stopped, and the zone which has still remained in the molten state above the solidified material can be caused to crystallize, a completely solidified block being obtained.

In order to achieve such a course of the crystallization, the crystallization front is held within the heating zone by the relative movement, already described, between the heating zone and mold. Advantageously, the heating zone is here moved upwards, with the mold at rest or rotating slowly, this movement advantageously being carried out essentially synchronously with the rise of the melt level in the mold. As already indicated, it is even possible, with ideal process control in the limiting case, that the crystallization front migrates upwards in the same way.

Such a completely or essentially synchronous coupling of the advance of the crystallization front and melt surface in the further course of the casting step is not, however, prescribed as indispensable. It has been found that blocks of excellent quality can also be obtained if there are fluctuations in the melt level. Advantageously, the melt level of the silicon located above the crystallization front is held in the range from 20 to 50 mm. Control can be effected via the heating power of the heating zone and the heating power of the melting station controlling the melt supply and advantageously by interaction of these two control parameters. As a rule of thumb, it can be said that, in most cases, the crystallization front is located at a distance corresponding to the said melt levels if the temperature of the molten silicon at the free surface is in the range from about 1425° C. to 1460° C. The temperature profile within the heating zone must, of course, be taken into account in this estimate.

In the growth phase, the heating device producing the heating zone, preferably a heating coil, is moved along with the rising filling level in the mold in such a way that the crystallization front is held within the heating zone. Advantageously, the zone of highest temperature is then located above the crystallization front and within or above the melt pool lying on top of the solidified silicon.

In a particularly advantageous manner, the height of the melt level in the mold, from which the intended position of the heating zone is ultimately derived, can be determined and controlled via the weight increase of the mold caused by the quantity of silicon fed in. This can be effected, for example, by means of known weight sensors which can be fitted, for example, to shaft 22. The particular measured weight, in conjunction with the mold cross-section can, starting from the empty weight of the mold as the starting value, be associated with a certain filling level, from which, in turn, a suitable position of the heating zone can be derived. Advantageously, this can be effected by means of a control unit, into which the control variables, resulting from the weight signal for the heating of the melting station and the heating zone and for the relative movement between mold and heating zone, have each been programmed. In principle, however, the process control can also be carried out completely, or at least partially, by hand.

A particularly effective fine control of the process can be achieved if additionally the temperature conditions in the mold are monitored, and this can be done all the more effectively the more accurately the position of the crystallization front at the time can be established from the detected values. By reducing or increasing the heating power in the heating zone, an acceleration or deceleration of the solidification rate can then be achieved, so that the crystallization front is held more accurately within the desired nominal range. At the same time, unduly wide fluctuations, in particular those leading to the concentration of impurities in the block, of the solidification rate can be prevented in this way, since the fine control can react early to changes in the thermal conditions, which can also be detected particularly rapidly by the temperature monitoring. The temperature can be monitored, for example, via pyrometers or thermocouples, it being possible, in principle, to use both the mold contents and the mold wall as reference systems. The resulting temperature values can be utilized as additional or governing control parameters in both manual control and computer control of the process.

Although, due to numerous process parameters available for variation, there is also a wide scope for varying the ultimately maintained or preset solidification rate and values of up to 4 mm/minute are possible, in principle. Values in the range from 0.1 to 2.5 mm/minute have proved to be advantageous. It has been found that the material solidified within this rate range shows excellent values in the diffusion lengths of the minority charge carriers, which are particularly important for the achievement of high efficiencies.

The growth phase can be arranged in such a way that the melt supply into the mold takes place essentially continuously. It is true that, in practice, it has proved to be easier to effect the melt feed in phases, so that the resulting increase of the melt level in the mold is also phased, and then to move the crystallization front, with the melt feed interrupted, up to a preset limit of the melt level, advantageously about 15 to 25 mm. Then the melt is allowed to flow in again until the previously fixed limit, as a rule, about 30 to 50 mm, has here, again, been reached. As experience shows, however, the quality of the material obtained is the higher, the shorter the phases are, so that ultimately, that process is the most advantageous in which a melt of almost constant level is uniformly advanced before the crystallization front. The values of the weight increase and the mold temperature are outstandingly suitable for monitoring and control.

When the intended block height has been reached, the heating power in the melting station is reduced to such an extent that no further molten silicon flows out, and the solidification process in the crystallization station is completed. Subsequently, if appropriate, after a tempering phase of about 30 to 500 minutes for a gradual decay of thermal stresses, the shaft, together with the mold, can be lowered into the distributor station. In the latter, the filled mold can be taken off the shaft and moved, for example, into a downstream cooling station, wherein the mold is cooled to the release temperature, as a rule, below 500° C. In the meantime, a prepared new mold can be placed upon the shaft, which is then moved up into the crystallization station for filling.

The block finally taken out of the cooled mold can be further processed in the usual manner to yield solar cells. If possible, the mold can be returned again into the production cycle after the processing, unless this is rendered impossible by unduly severe damage.

The process according to the invention, thus, allows polycrystalline silicon blocks to be cast by zonal solidification while maintaining an essentially flat crystallization front and an optimized solidification rate. Within the blocks, the material obtained shows an almost vertical direction of the columnar single-crystal domains and, at the same time, a particularly low level of impurities, due to the apparatus, such as in particular the carbon or metals. Equally, as compared with the solar cell base materials obtained by the known casting processes, it is distinguished by significantly higher values for the diffusion lengths of the minority charge carriers, which almost reach those typical of single-crystal crucible-drawn material. Thus, solar cells having efficiencies which have hitherto been achievable only at high cost, or not at all, can be produced from this cast material, according to the invention.

The present invention will now be further disclosed by reference to the following example, which is supplied solely for the purpose of illustration and is not intended to define the limits and scope of the present invention.

EXAMPLE

In an installation constructed analogously to that shown in the FIGURE, the silicon reservoir of the charging station was charged with a quantity of about 25 kg of lumpy polycrystalline silicon (mean particle size about 30 mm). Through a shaking channel, a starting charge of about 2.5 kg of this material was then charged into the quartz melting crucible (height about 20 cm, diameter about 20 cm, outlet orifice about 8 mm in diameter) of the melting station, the crucible having been preheated to about 1350° C. by means of the surrounding resistance heater cylinder.

At the same time, a graphite mold (height about 25 cm, external diameter about 32 cm, internal cross-section $21 \times 21$ cm$^2$) was moved up from the evacuated, argon-purged distributor station into the crystallization station until its orifice was located just below the interposed plate. Already during this step, heating energy was coupled into the graphite heating wall surrounding the mold via the inductive heating coil (diameter about 50 cm, height about 10 cm, copper as the material) located in the base position at the lower end of the crystallization station, so that the mold walls were simultaneously baked on moving through the heating zone thus produced. Finally, the cavity formed by graphite spacer rods between the mold bottom and the carrier plate was located at the level of the heating zone, whose level was predetermined, as a first approximation, by that of the heating coil producing it.

Both the coil power and the melting power were then increased until the molten silicon, initially issuing only dropwise from the melting crucible, started to flow in an almost continuous jet into the mold. As soon as the increase in the mold weight indicated that a melt level of about 2 cm had been reached, the heating power in the melting station was slightly reduced, so that the melt jet weakened a little.

At the same time, the heating coil was moved up until the zone of maximum temperature within the heating zone was at the level of the inside surface of the mold bottom. The heating power of the coil was then adjusted such that the temperature at the melt surface was in the range from about 1430° C. to 1440° C. Subsequently, with unchanged heating power, the coil was then gradually moved further up until the zone of maximum temperature (whose position essentially corresponds to the cross-sectional plane through the coil center) was slightly above the melt surface. During this step, silicon started to solidify from the mold bottom until a substantially flat layer of solidified silicon had formed, on which the silicon melt was superposed. Thus, a suitable substantially flat crystallization front had been stabilized.

In the growth phase then following, the heating power in the melting station was, on the one hand, adjusted such that the quantity of silicon introduced therein fused gradually and flowed as a phased jet into the mold, silicon being periodically recharged from the reservoir. The increase in the mold weight corresponded, on average, to a melt rise by about 0.2 mm/minute. The heating coil and, thus, the heating zone, were moved upwards at a rate of likewise about 0.2 mm/minute, which approximately also resulted in an identical value for the solidification rate of the silicon. During the entire process, it was possible, by adjustment of the process parameters, to maintain the melt level of the melt pool, which was pushed forward in the mold before the crystallization front, essentially constant at about 20 mm.

The casting procedure was continued in this way, and the block height in the mold was steadily increased. Starting at a block height of about 15 cm, the water-cooled cooling head of the shaft, rotated throughout the entire casting process (about 10 rpm), was moved up to the mold bottom, without coming into direct contact with it, in order to assist the heat removal by radiation.

After the melt level in the mold had reached the intended value of the block height (about 23 cm), the heating power in the melting station was reduced and the melt jet was stopped. The movement of the inductive heating coil was continued with simultaneous gradual reduction in the heating power until the melt level at the upper end of the block continued to decrease, and eventually, the block was completely crystallized throughout.

After the end of the subsequent phase of tempering for about 4 hours, during which the block temperature was reduced to about 500° C., the shaft was lowered, with continued rotation, and the mold was moved down from the crystallization station into the distributor station. At the same time, the heating coil was moved back into the starting position.

By means of a transport fork, the mold was then moved, after stopping of the shaft rotation, into a cooling station in which the block was able to cool to room temperature. A new carrier plate with a mold, by means of which a further casting step could be carried out in an analogous manner, was placed upon the shaft.

The silicon block was removed from the cooled mold and sawn apart, by means of an exterior separating saw, in such a way that, ultimately, four blocks of the intended dimensions, namely a cross-section of 10×10 cm$^2$ and a block height of 20 cm, were available.

All the blocks showed an almost vertical alignment of the single-crystal domains in their columnar structure. The resistivity of the material was found to be 1.5 Ωcm and was, thus, within the range of the values typical of crucible-drawn material. The diffusion length, determined by the method described in the article by J. M. Borrego et al, entitled "Non-destructive Lifetime Measurement in Silicon Wafers by Microwave Reflection," published in Solid State Electronics, vol. 30, No. 2, pp. 195-203 (1987), of the minority charge carriers about 170 μm. It, thus, almost reached the value of 200 μm typical of crucible-drawn single-crystal material and was significantly above the value of about 110 μm typical of material obtained by the conventional casting processes. The lifetime values of the minority charge carriers were in a range just above 10 μsec and, hence, in a range which allowed excellent efficiencies to be expected for solar cells made from the product.

For a check, solar cells were made by a conventional standard process from the polycrystalline silicon obtained, and their efficiencies were determined. These were about 15 percent on average. By contrast, the efficiencies of solar cells which were made by the same standard process and in which the base material used by polycrystalline silicon obtained by a conventional casting process, were 13 percent on average.

While only a single embodiment of the present invention has been shown and described, it is to be understood that many changes and modifications may be made thereunto without departing from the spirit and scope of the invention as defined by the appended claims.

What is claimed is:

1. A process for casting polycrystalline silicon blocks as a base material for solar cells, comprising:
   gradually fusing solid silicon in a melting station by supplying heating power to the melting station;
   releasing the fused silicon therefrom continuously, or in phases into a mold, said mold having a bottom and a bottom region, thereby causing an increasing filling level of the mold with molten silicon;
   after covering said mold bottom with molten silicon, starting the solidification of silicon from the mold bottom, thereby generating a crystallization front between solidified and fused silicon;
   stabilizing said crystallization front with an energy supply to a heating zone surrounding said bottom region of the mold;
   moving the crystallization front in the direction of the increasing filling level of the mold by a relative movement between the mold and the heating zone, the crystallization front being held within the heating zone;
   controlling a melt level of the molten silicon superimposed upon the crystallization front by matching the quantity of molten silicon released from the melting station to the energy supply to the heating zone;
   stopping the feeding of molten silicon into the mold after the intended filling level has been reached; and
   causing the remaining molten silicon in the mold to crystallize so that a completely solidified silicon block having approximately vertically oriented crystallites is obtained.

2. The process as claimed in claim 1, comprising stabilizing the crystallization front at an essentially flat shape.

3. The process as claimed in claim 1, comprising holding the melt level of the molten silicon superposed upon the crystallization front within the range from 20 to 50 mm.

4. The process as claimed in claim 1, comprising monitoring the filling level of the mold by its increase in weight.

5. The process as claimed in claim 1, wherein the heating zone has a height, and the mold has an external diameter; and the height of the heating zone corresponds to 0.1 to 0.5 times the external diameter of the mold.

6. The process as claimed in claim 1, wherein the crystallization front is moved at a rate of up to 4 mm/minute.

* * * * *